US011158560B2

(12) United States Patent
Robinson et al.

(10) Patent No.: US 11,158,560 B2
(45) Date of Patent: Oct. 26, 2021

(54) THERMAL STRUCTURES FOR DISSIPATING HEAT AND METHODS FOR MANUFACTURE THEREOF

(71) Applicant: THE PROVOST, FELLOWS, FOUNDATION SCHOLARS, & THE OTHER MEMBERS OF BOARD, OF THE COLLEGE OF THE HOLY & UNDIV. TRINITY OF QUEEN ELIZABETH NEAR DUBLIN, Dublin (IE)

(72) Inventors: Anthony James Robinson, County Meath Laytown (IE); Rocco Lupoi, Dublin (IE)

(*) Notice: Subject to any disclaimer, the term of this patent is extended or adjusted under 35 U.S.C. 154(b) by 55 days.

(21) Appl. No.: 16/644,297

(22) PCT Filed: Sep. 4, 2018

(86) PCT No.: PCT/EP2018/073785
§ 371 (c)(1),
(2) Date: Mar. 4, 2020

(87) PCT Pub. No.: WO2019/043269
PCT Pub. Date: Mar. 7, 2019

(65) Prior Publication Data
US 2020/0194334 A1    Jun. 18, 2020

(30) Foreign Application Priority Data

Sep. 4, 2017   (EP) .................................... 17189219

(51) Int. Cl.
*H01L 23/36*   (2006.01)
*H01L 23/367*  (2006.01)
(Continued)

(52) U.S. Cl.
CPC ...... *H01L 23/3672* (2013.01); *H01L 21/4871* (2013.01); *H01L 23/3732* (2013.01);
(Continued)

(58) Field of Classification Search
None
See application file for complete search history.

(56) References Cited

U.S. PATENT DOCUMENTS 10,751,912 B2 *   8/2020  Ota ...................... H01L 21/4871
2017/0268834 A1 * 9/2017  Ishihara ................... C22C 47/12

* cited by examiner

*Primary Examiner* — Benjamin P Sandvik
(74) *Attorney, Agent, or Firm* — Whiteford, Taylor & Preston, LLP; Gregory M. Stone

(57) ABSTRACT

A thermal structure for dissipating heat from a semiconductor substrate has a semiconductor substrate having an external surface which may be roughened. An optional base layer comprising aluminium is formed on top of the external surface by a cold spraying process, and a top layer comprising a matrix of copper and diamond is formed above the substrate, and above the base layer if present, by cold spraying a powder mixture of copper and diamond particles. The top layer is thereby created as a matrix of copper formed by the deformation of the copper particles on impact with the underlying surface and a dispersed phase comprising the diamond particles embedded within the copper matrix. The resulting structure has high thermal conductivity and a coefficient of thermal expansion that is well matched to the substrate, and eliminates the need for a thermal interface material or paste.

30 Claims, 8 Drawing Sheets

(51) Int. Cl.
*H01L 21/48* (2006.01)
*H01L 23/373* (2006.01)
*C23C 24/04* (2006.01)

(52) U.S. Cl.
CPC ...... *H01L 23/3733* (2013.01); *H01L 23/3736* (2013.01); *C23C 24/04* (2013.01)

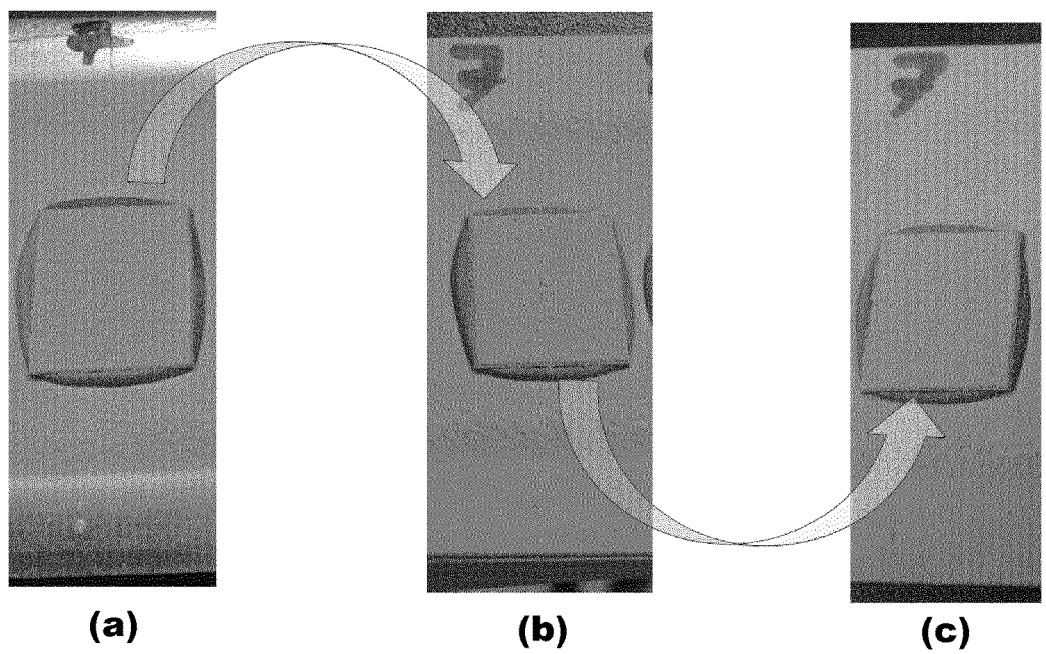
Fig. 8
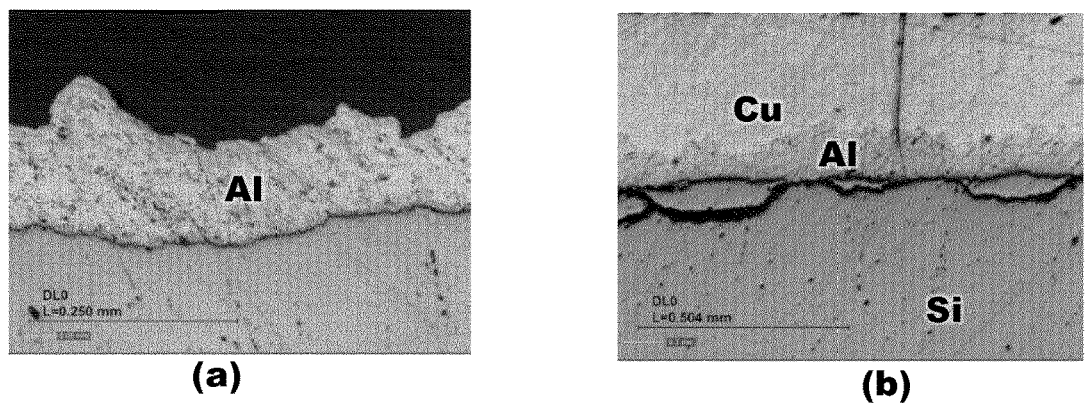
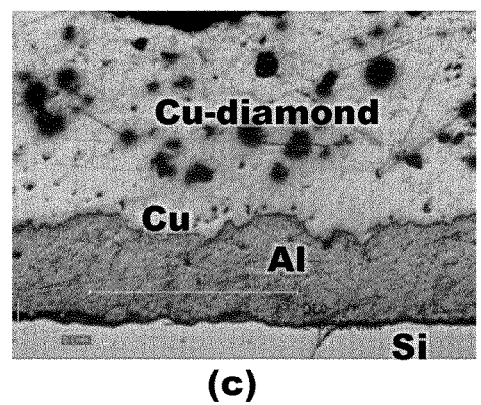
Fig. 9

THERMAL STRUCTURES FOR DISSIPATING HEAT AND METHODS FOR MANUFACTURE THEREOF

TECHNICAL FIELD

This invention relates to thermally conductive structures and to methods of manufacturing such structures. It has particular application to the manufacture of heat spreaders, heatsinks and heat exchangers.

BACKGROUND ART

Heat spreaders, heatsinks and heat exchangers are ubiquitous in semiconductor electronics, and also find application in other electronic, electrical and mechanical systems which generate significant heat that needs to be dissipated.

Two particularly important properties of any heat spreader material or structure are the thermal conductivity (TC) and coefficient of thermal expansion (CTE). Long term reliability of many devices demands heat spreader materials having a high TC in order to provide effective cooling, and thus safe operating temperatures. However, since cooling relies on an efficient transfer of heat from the component or device, and this in turn often implies that there is a good thermal contact for conduction to take place, reliability can also be compromised by thermal stresses caused by operation cycles and CTE mismatches between the device and the heat spreader.

Thus, in semiconductor electronics for example, materials having high TC and matched CTEs with Si, InP, GaAs or GaN are important for heat spreader applications. Indeed, scientists and engineers have been aggressively researching novel high-TC/low-CTE composite materials for about a decade. This urgency is mainly driven by escalation in heat flux levels of electronics and the arrival of highly portable electronics devices such as tablets, smartphones and lightweight laptops.

High conductivity metals (Cu, Ag, Al) have CTEs in the range of $15\text{-}20\times10^{-6}$/K which is simply too high for rigid attachment to semiconductors, which have typical CTE ranges closer to $3\text{-}7\times10^{-6}$/K. To address the CTE mismatch issue, materials such as AlN, $Al_2O_3$ ceramics and Cu—W, Cu—Mo, Al—SiC composites are available. However, for CTEs of practical interest the TCs currently available are only ~200 W/mK. For modern CPUs and most other high powered devises, this is too low to effectively remove current, let alone future heat loads.

Where the semiconductor die is contained within a package the heat spreader may need to be mounted to (and thermally matched with) the material forming the exterior of the package, such as a polymeric or ceramic material.

Cu, which is the current heat spreader material of choice due to its high TC, low cost and ease of manufacture, is itself becoming ineffective as heat flux levels continue to escalate in tandem with Moore's Law. Furthermore, due to the large CTE mismatch between CU and the semiconductor die, a thick layer of thermal grease (called TIM1, i.e. thermal interface material, layer 1) must be applied between the semiconductor and the copper heat spreader to absorb the shear caused by differential thermal expansion. This TIM1 layer results in a significant additional thermal resistance and itself can suffer from long term reliability issues due to the operational cycles and CTE mismatching causing 'pump-out' of the grease.

Another maturing technology is diamond deposited using chemical vapour deposition (CVD). CVD diamond has a TC ~1500 W/mK, though it is so expensive (20 times that of powder based materials) that it is used in only those very specialized applications that are not cost sensitive. Also, its CTE is notably lower than most semiconductors so it still in fact suffers from CTE mismatch issues.

US 2012273803 A1 discloses a thermal dissipation substrate formed using a substrate having a plurality of concave regions on an upper surface. The concave regions are coated with an adhesive bonding material, such as an epoxy, before being filled with diamond pellets, so that the diamond pellets are held in place by the adhesive bonding material. An over-layer of bonding material is then deposited on top, encapsulating the diamond pellets within pockets. The over-layer of bonding material is bonded to a heat source, and then the underside of the original substrate is polished away to remove redundant material and to raise the thermal coefficient of the whole substrate.

Cold spraying (CS) provides an alternative to CVD or to bonding via a thermal grease. CS is an additive manufacturing technology capable of producing coatings of metals, composites, ceramics and polymers onto a variety of substrate materials. This is accomplished by accelerating small particles (1-60 µm range) up to supersonic speed in a nozzle using a carrier gas. Upon impact against a substrate, the particles plastically deform and bond to it. CS is fast, suitable for large areas, environmentally friendly, low cost and represents an attractive alternative to a number of traditional methods such as electroplating or plasma spray. CS has proven to be completely solid-state (i.e. free of melting), and has been successfully applied for the deposition of a wide variety of materials for different applications including but not limited to Ti and its alloys, Al—Ti combinations, WC—Co, Cu, Diamond. The structure formed by a cold spray process is qualitatively different in appearance and properties from a corresponding structure formed by thermal processes such as sintering. The term "cold" denotes that the melting temperature of the coating and/or substrate is not reached.

It is an aim of the present invention to provide alternative thermal structures on semiconductors that exhibit a combination of high TC and low CTE.

DISCLOSURE OF THE INVENTION

In one aspect, there is provided a thermal structure for dissipating heat from a substrate, comprising:
- a semiconductor substrate having an external surface;
- a base layer of a ductile material capable of exhibiting plastic deformation, formed on top of said external surface; and
- a top layer comprising a matrix of metal and diamond formed above the base layer by cold spraying a powder selected from:
  - a powder mixture of metal and diamond particles, and
  - a powder of metal-clad diamond particles,
- wherein the top layer is formed of a matrix of metal formed by the deformation of the metal components of the powder on impact with the underlying surface and a dispersed phase comprising the diamond particles embedded within the metal matrix.

The base layer is of a ductile material, i.e. one which exhibits plastic deformation when tested using standard compression or tensile tests such as European Standard EN ISO 6892-1:2016 or ASTM E8/E8M. Excluded therefore are brittle materials which exhibit no plasticity before fracture. Examples of particularly suitable ductile materials are aluminium, copper, zinc, and polymers including thermoplastic materials such as acrylonitrile butadiene styrene (ABS), polyether ether ketone (PEEK), polytetrafluoroethylene (PTFE), nylon and other polyamides, or polyvinyl chloride (PVC), as well as composites containing these materials.

The preferred metal providing the matrix in which the diamond is dispersed is copper, although it is also possible to use other metals with suitable TC and CTE characteristics, such as aluminium. It is also possible for the matrix to incorporate other metals such as nickel, particularly where such metals are used in metal-clad diamond particles to promote adhesion of a copper layer to the diamond.

It has been found that copper-diamond matrixes formed by cold spraying are highly thermally conductive and have a low CTE, making them extremely suitable for thermal applications such as in heat spreaders.

Specifically, the interface between the base layer and cold-sprayed top layer is effectively continuous, because of how the newly deposited particles in a cold sprayed powder conform to the surface which they impact. It will be appreciated that the low degree of CTE mismatch means that a thermal dissipation structure can be formed directly onto a semiconductor substrate, eliminating the use of TIMs (thermal interface materials) which are a cause of failure of known heat sinks and which provide a thermal barrier between the semiconductor and the copper in a conventional heat sink.

The base layer has three functions: (1) it improves the bond between the top layer and the underlying substrate, (2) it provides thermal continuity between the substrate and the top layer, and (3) it shields the substrate from the impact energy of the particles used in cold spraying the top layer. Particularly in cases where a copper-diamond top layer is formed by cold spraying and where the substrate is a semiconductor which might otherwise fracture due to the impact energy of the copper particles (or copper-clad diamond particles) used, the presence of a ductile base layer absorbs and spreads the impact energy, preventing damage to the substrate.

Commercially off the shelf (COTS) metal-diamond composites are required to be stacked and fastened to substrates, requiring a TIM layer to reduce thermal contact resistance, which is disadvantageous with regard to the net thermal resistance of the assembled package.

Because cold spraying results in plastic deformation with no melting, the structure of a cold sprayed layer is distinguishable from layers of similar materials formed by sintering, CVD, or other processes. Specifically, once a sample has been prepared for observation, one can observe (using an optical microscope or a scanning electron microscope for example) a clear distinction between the substrate and the sprayed layer, without the addition of an "intermediate" layer that could represent, in a thermal process, the Heat Affected Zone or clear evidence of the strong formation of intermetallics. Basically, where material A is cold-sprayed onto material B, the cold spray process will be identifiable by the fact that an intermediate layer (a little bit of A and little bit of B) at the interface is by and large absent.

CS fabrication of Cu-Diamond composites is a mechanical process based on large plastic deformation of the softer metal carrier with the hard diamond filler. The high-strain plastic deformation forms intimate mechanical and thus thermal contact between the metal carrier and the diamond, and results in a low interfacial thermal barrier between them. This is not the case with phase transformation manufacturing processes, such as sintering, because of the hydrophobic nature of metals, such as copper, with diamond. The very poor wetting of the diamond creates thermal interface resistance between the carrier metal and diamond and results in effective thermal conductivities that have been shown to be lower than the conductivity of the base metal itself. The diamond then acts as a barrier to heat flow thus eliminating any positive influence associated with its higher thermal conductivity. This effect is avoided using the CS solid state mechanical forming of the metal-Diamond composite.

Advantageously, CS fabrication is an additive manufacturing process which facilitates the manufacturing of bespoke layers, structures and features directly onto and around substrates. Metal-diamond composites manufactured using conventional fabrication techniques, such as sintering, are produced in volume in a narrow range of dimensions and shapes. Fabricating bespoke features from these is very problematic as it requires subtractive manufacturing processes, such as milling, which is very destructive to tooling due to the diamond content of the composite.

In preferred embodiments, the base layer is formed on top of said external surface by a cold spraying process, with said top layer being formed above the base layer, wherein the base layer is formed of (i) a metal, (ii) a composite comprising at least two metals, or (iii) a composite comprising a metal and a non-metal.

Tests have found that copper-diamond cold sprayed matrix layers do not always bond well when applied directly to silicon and other semiconductor substrate surfaces. Providing a base layer of this type has been found to provide strong adhesion without unduly affecting the TC or CTE performance. This is particularly true when the base layer is cold sprayed, due to the high continuity exhibited through the final structure.

As an alternative to cold spraying, the base layer might be formed by electro deposition, physical vapour deposition (PVD), or chemical vapor deposition (CVD).

It is possible to improve the adhesion of the sprayed particles to the substrate by roughening the semiconductor surface. While this is by no means essential it can be done in appropriate cases. Roughening provides protrusions and depressions around which the aluminium particles can deform upon impact to promote better adhesion.

Preferably, the base layer is formed of aluminium or of a composite of aluminium and one or more metal or non-metal components.

Aluminium is a particularly preferred material for a base layer when the substrate is a semiconductor and the top layer is copper-diamond, because it bonds well both below (to the silicon surface) and above (to the copper-diamond matrix), while retaining very favourable thermal conductivity between the substrate and top layer.

Preferably, said base layer is formed by cold spraying aluminium powder having an average particle size of between 5 and 100 μm, more preferably between 10 and 60 μm.

Preferably, said base layer has an average thickness between 30 and 500 μm, more preferably between 50 and 250 μm.

In alternative embodiments, the base layer is formed of copper, of a composite of copper and one or more metal or non-metal components.

Preferably, in such cases, said base layer is formed by cold spraying copper powder or a composite containing copper and having an average particle size of between 0.5 and 15 μm, more preferably between 1 and 10 μm.

The smaller particle size is particularly advantageous when the substrate is a semiconductor wafer or chip, because it provides reduced impact energy, below the fracture energy of the substrate.

A further alternative is a base layer formed by cold spraying either a powder mixture of metal and diamond particles, or a powder of metal-clad diamond particles, said powder mixture or powder having an average particle size of between 0.5 and 15 µm, more preferably between 1 and 10 µm.

Preferably, for copper, copper composite, or copper-diamond base layers, the base layer has an average thickness between 5 and 50 µm, more preferably between 10 and 30 µm.

In another alternative embodiment, said base layer comprises aluminium and copper, and is formed by cold spraying a mixture of copper and aluminium particles.

A preferred copper and aluminium base layer comprises a mix of aluminium and copper in the ratio (w/w) of between 30:70 and 70:30, more preferably between 40:60 and 60:40.

Optionally, said external surface of the substrate is roughened prior to formation of the base layer by a process selected from chemical etching, sand blasting and laser etching.

Preferably, said external surface of said substrate has a roughness average ($R_a$) value of between 1 and 25 µm, more preferably between 3 and 20 µm, most preferably between 7 and 15 µm.

Preferably, said top layer comprises a mix of copper and diamond in the ratio (w/w) of between 30:70 and 90:10, more preferably between 50:50 and 90:10, even more preferably between 75:25 and 90:10, most preferably around 80:20.

Preferably, where said powder is a powder mixture of metal and diamond particles, said metal particles in said mixture have an average size of between 10 and 60 µm.

Preferably, said diamond particles in said mixture or in said metal-clad diamond particles have an average size of between 10 and 200 µm, more preferably between 20 and 100 µm.

Preferably, when said powder is a powder of metal-clad diamond particles, the metal is copper.

Preferably, such particles comprise diamond grit having an average size in the range 20-100 µm, and coated with a copper layer 2-8 µm thick.

Optionally, the particles may further comprise a 1-3 µm layer thickness of nickel applied to the diamond to assist with copper deposition, with the copper layer being applied over the nickel layer. The nickel can advantageously be applied by electroplating.

Preferably, in each grain the preferred weight ratio between diamond and Ni/Cu is between 70-30 and 30-70, more preferably approximately 50-50.

Preferably, said top layer has an average thickness of between 0.3 mm and 5 mm.

Optionally, an intermediate layer of copper may be provided on top of the aluminium base layer by a cold spraying process, with the top layer being cold sprayed onto said intermediate layer.

The advantage of the intermediate copper layer is that it promotes a better bond between the base layer and the top layer. The copper powder, when cold sprayed, forms a good bond with the layers both above and below it. In addition, the copper layer provides a buffer layer of a softer material which can reduce the impact effects of high-velocity diamond particles on the underlying silicon substrate.

Preferably, when an intermediate layer is present, the intermediate layer is formed by cold spraying copper powder having an average particle size of between 10 and 60 µm.

Preferably, the intermediate layer has an average thickness of between 0.1 mm and 1 mm.

Preferably the top layer, at an outer or exposed surface (distal from the substrate), is provided with multi-scale features relative to the bulk of the top layer, with a preferred feature size of between 0.5 µm and 120 µm. Such features can provide a variation in porosity to enhance boiling.

It is possible to add a final top surface (100-300 µm thick), that could be made by only diamond spray or copper-clad diamond spray. This can play a role in the variation of porosity, apart from the cold spray parameters already listed herein.

More preferably, said increased porosity results from variation of the cold spray parameters during the application of the outermost part of the top layer by one or more of: varying the nozzle inlet pressure, the standoff distance, the particle feed rate, and the relative movement between substrate and nozzle.

The increased porosity enables enhanced boiling, and thus better heat transfer from the structure to a surrounding liquid. This is not known in a copper-diamond structure as an intimate integrated feature of the heat spreader to the best knowledge of the inventors. By providing continuous featuring of the final exposed surface made of high TC composite, and omitting TIM2 (or other contact resistances), improved boiling results.

The same principles and techniques can be used to provide a coating that may replace fins or other conventional enhanced boiling structures, i.e. by depositing a copper-diamond coating on a heat spreader and enabling increased porosity on the outer surface of the deposited layer with multi-scale features.

Preferably, said substrate is a semiconductor and more preferably it is formed of silicon, germanium, gallium arsenide, silicon carbide, gallium nitride, gallium phosphide or cadmium sulphide.

In another aspect, there is provided a method of manufacturing any of the above thermal structures for dissipating heat from a substrate, the method comprising the steps of:
  providing a semiconductor substrate having an external surface; and
  forming a base layer of a ductile material capable of exhibiting plastic deformation, on top of said external surface; and
  forming a top layer above the substrate by cold spraying a powder selected from:
    a powder mixture of metal and diamond particles, and
    a powder of metal-clad diamond particles;
whereby a matrix of metal is formed by the deformation of the metal particles on impact with the underlying surface and a dispersed phase comprising the diamond particles is embedded within the metal matrix.

Further details of the method are apparent from the dependent product claims whose features are recited above.

BRIEF DESCRIPTION OF THE DRAWINGS

The invention will now be further illustrated by the following description of embodiments thereof, given by way of example only, with reference to the accompanying drawings, in which:

FIGS. 8(a) to 8(c) show successive steps in manufacturing a thermal structure;

FIGS. 9(a) to 9(c) are SEM micrographs through the three samples of FIGS. 8(a) to 8(c) respectively;

DETAILED DESCRIPTION OF PREFERRED EMBODIMENTS

Figure 1:
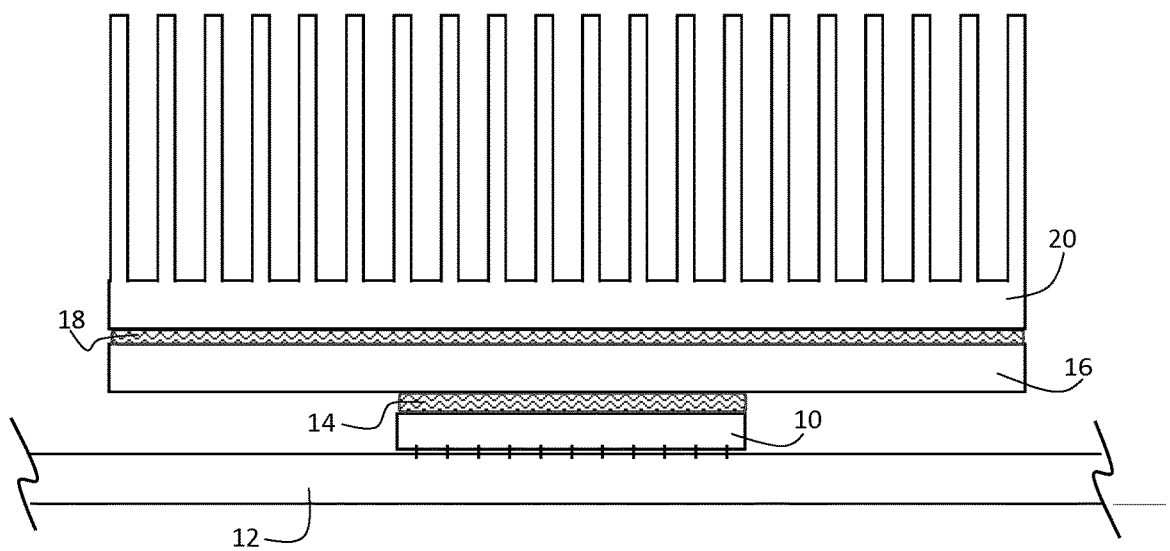
FIG. 1 is a sectional view of a known thermal structure for dissipating heat in an electronics device.

FIG. 1 is a sectional view showing a known thermal structure for dissipating heat in an electronics device. A semiconductor chip 10 is mounted on a circuit board 12. A first thermal interface material (TIM) layer 14 comprising a thermal paste, is deposited on a top surface of the chip 10, to provide a thermally conductive bond to a copper heat spreader 16 which provides an expanded surface for connecting the chip to a heat sink 20. A second TIM layer 18 is used to mount the heat sink 20 onto the heat spreader 16.

It will be appreciated that the known system of FIG. 1 is problematic because of the conductivity losses associated with the TIM layers, because the CTE of copper is mismatched to silicon, and because over time the TIM paste degrades, particularly when exposed to repeated stresses due to the coefficient of thermal expansion mismatch between the surfaces it is bonded to.

A further disadvantage is that several manufacturing steps are required to create the structure of FIG. 1.

In order to fabricate a high-TC/low-CTE composite material, a high-TC metal binder/matrix is here combined with a low-CTE dispersed phase. The effective thermal conductivity of the composite, $k_{eff}$, can be well approximated by Maxwell's theory given as:

$$k_{eff} = k_m \left( 2\left(\frac{k_d}{k_m} - 1\right)\varepsilon_d + \frac{k_d}{k_m} + 2 \right) \left( \left(1 - \frac{k_d}{k_m}\right)\varepsilon_d + \frac{k_d}{k_m} + 2 \right)^{-1} \quad \text{Eq. 1}$$

where $k_m$ is the conductivity of the matrix material, $k_d$ is that of the dispersions and $\varepsilon_d$ is the volume fraction of the dispersed phase. Of course, if $k_d > k_m$ then $k_{eff} > k_m$ and $k_{eff}$ increases with increased volume fraction of the dispersed phase, $\varepsilon_d$. In a like manner, the effective CTE of the composite, $\alpha_{eff}$, can be approximated by the Kerner equation:

$$\alpha_{eff} = \alpha_1 + \varepsilon_d (\alpha_2 - \alpha_1) \left[ \frac{K_m(3K_d + 4G_m)^2 + (K_d - K_m)(16G_m^2 + 12G_m K_d)}{(4G_m + 3K_d)[4\varepsilon_2 G_m(K_d - K_m) + 3K_d K_m + 4G_1 K_1]} \right] \quad \text{Eq. 2}$$

where $\alpha_i$, $K_i$ and $G_i$ are the volume expansion coefficient, the bulk modulus and the shear modulus of phase i respectively. The expression shows that if $\alpha_d < \alpha_m$ then $\alpha_{eff} < \alpha_m$ and $\alpha_{eff}$ decreases with increased volume fraction of the dispersed phase, $\varepsilon_d$.

Figure 2:
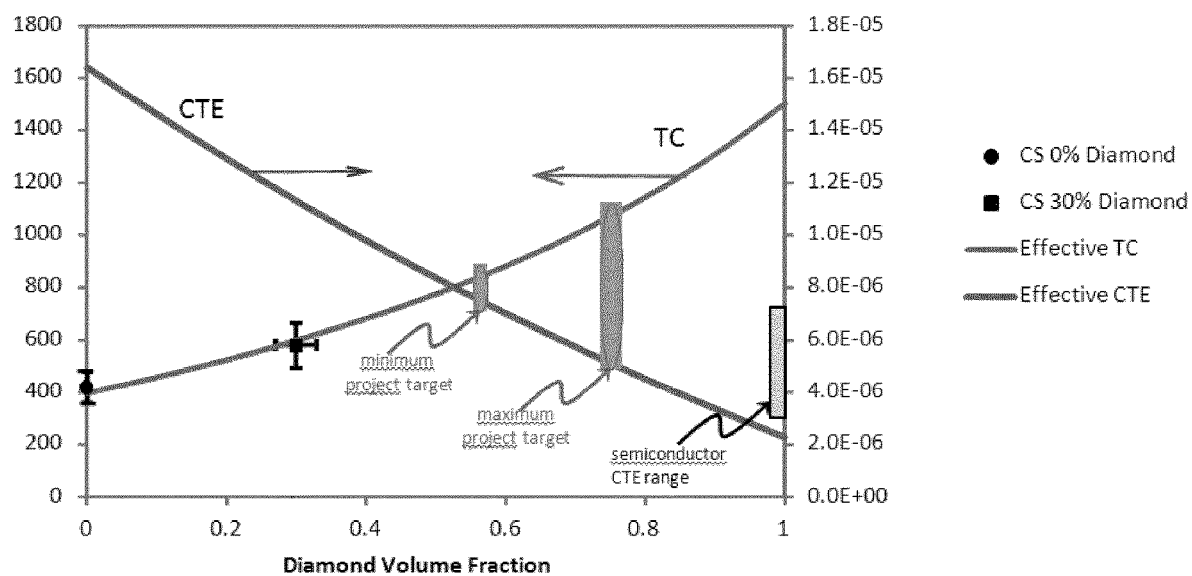
FIG. 2 is a graph of the thermal conductivity (TC) and coefficient of thermal expansion (CTE) of Cu-Diamond composite materials with different levels of diamond.

FIG. 2 graphs the thermal conductivity (TC) and coefficient of thermal expansion (CTE) of Cu-Diamond composite materials with different levels of diamond as a percentage w/w. Also shown are experimental thermal conductivity measurements of cold sprayed copper and cold sprayed copper-diamond matrix, produced by cold spraying a powder mixture containing 30% diamond, which shows agreement with theory. The diamond percentage can be increased up to about 70% before the composite becomes too brittle. It is possible to add a third component, such as a material with a negative coefficient of thermal expansion to alter the plot line for the composite.

The high thermal conductivities of both the matrix (kCu~400 W/mK) and dispersed (kDia~1500-2000 W/mK) materials, together with the fact that the CTE of diamond is typically around 15% that of Cu, mean that the use of a Cu-diamond matrix is a promising material for thermal dissipation of heat from silicon and other semiconductor materials.

Cu-Diamond composites were fabricated using cold spraying (CS) along with pure Cu samples. The latter were fabricated to provide a baseline sense of the porosity of pure CS fabricated matrix material, which is easily obtained from the density measurement of the sample.

Figure 3:
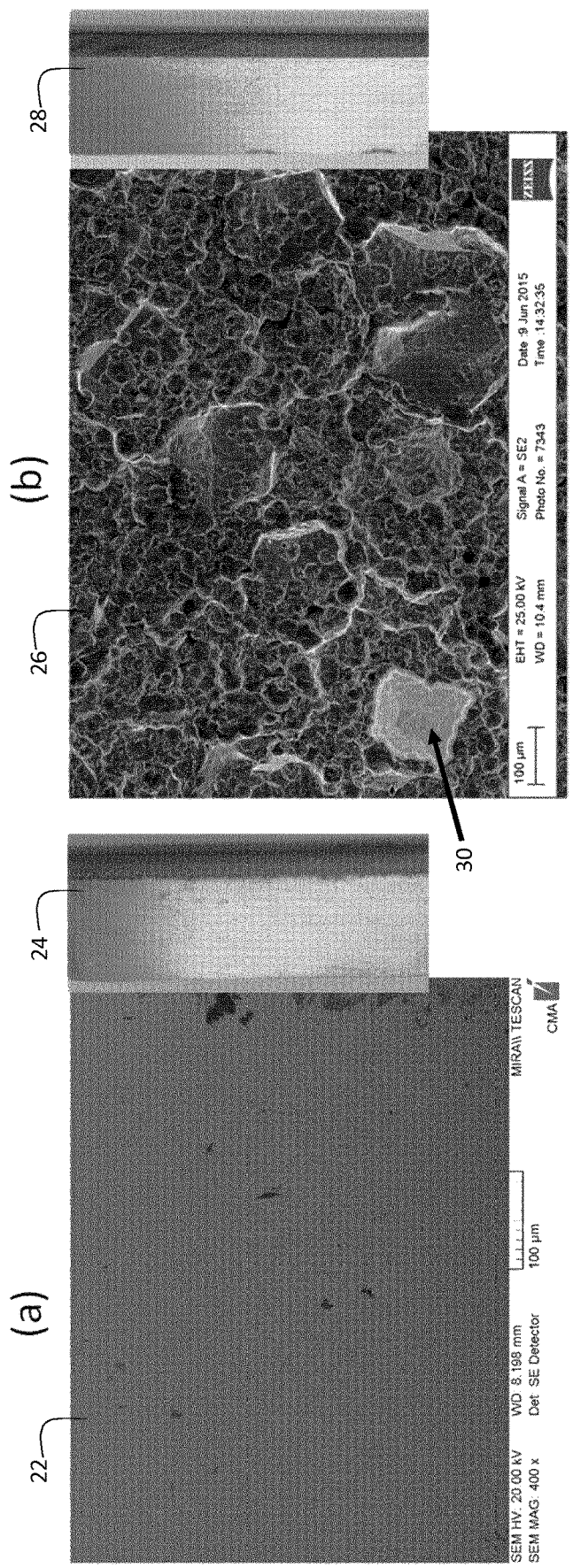
FIGS. 3(a) and 3(b) are images of cold sprayed pure copper and copper-diamond layers, respectively.

FIG. 3(a) shows a scanning electron microscope (SEM) image 22 and photograph 24 of the pure CS Cu sample. The copper powder used for cold spraying had a particle size of 10-60 μm. It is clear that is it more-or-less continuous Cu, and this is verified by a density measurement which was found to be that of pure Cu, within experimental uncertainty (±5%). This is further verified by the thermal conductivity measurement of the CS 0% Diamond sample shown in FIG. 2, which shows that it is that of pure Cu, within experimental uncertainty (±10%).

FIG. 3(b) shows a SEM image 26 and photograph 28 of a CS 30% Diamond grit (100 μm) Cu-Diamond composite. A diamond particle is highlighted and indicated at 30. Importantly, the thermal conductivity measurement together with the density measurement (which was used to estimate Ed) not only verify that the diamond particles are present and participating positively with regard to thermal conductivity of the composite, but the close agreement with Maxwell's theory strongly suggests that the CS fabrication technique forms a composite with a low Cu-Diamond interfacial thermal barrier.

Yoshida & Morigami have shown (see K. Yoshida, H. Morigami, "Thermal properties of diamond/copper composite material," Microelectronics Reliability 44 (2004) 303-308) that interfacial thermal resistance can reduce the thermal conductivity to well below Maxwell's prediction for sintered Cu-Diamond; even to the extent that for moderate $\varepsilon_d$ and small particle sizes (~20-30 μm) the composite material effective thermal conductivity is below that of Copper, by almost half. The cause for this phenomenon is poor wetting of Diamond by the Cu-melt during sintering, which is not the case here. Thus, from a materials fabrication stand point this is a very exciting result in itself, before considering the fact that this has been fabricated using a 3D printing technique. It should also be noted that all relevant studies have shown that the use of the Kerner equation well predicts the CTE of Cu-Diamond composites.

Figure 4:
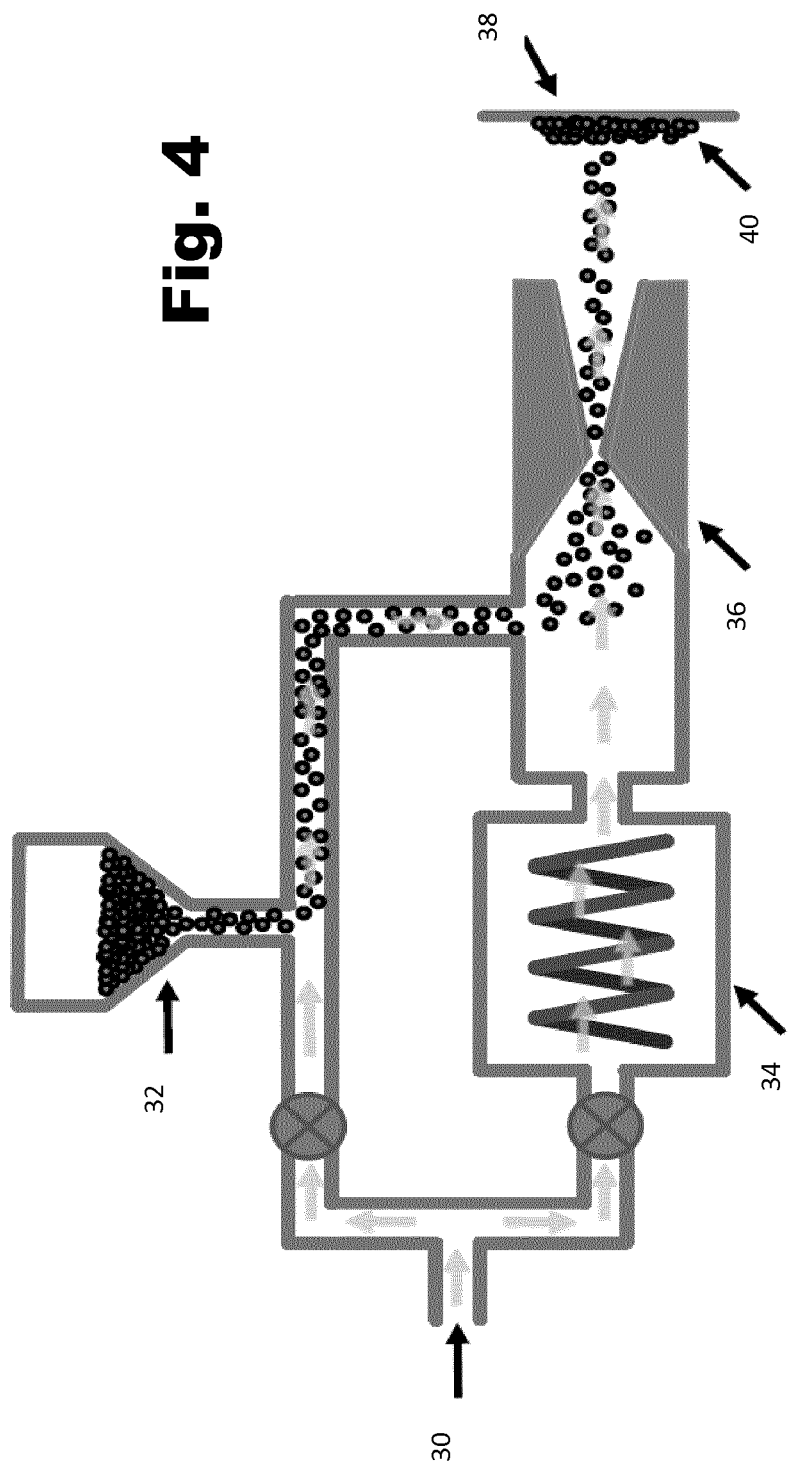
FIG. 4 is a schematic diagram of a cold spraying apparatus.

FIG. 4 is a schematic diagram of a cold spraying apparatus used to create the structures described herein. A pressurised gas source 30 feeds the apparatus and is split into two streams. An upper stream passes by and picks up powder particles from a powder feeder 32. The lower stream passes through a gas heater 34 to increase the gas temperature, hence sonic speed, hence actual velocity at the nozzle exit, before the heated gas stream and the stream carrying the entrained powder particles are reunited. The reunited gas stream and the entrained particles pass through a supersonic nozzle 36 which accelerates the particles to impact a substrate 38. The particles deform plastically and adhere to the substrate and one another to provide a deposited layer 40 whose thickness and shape can be controlled by moving the substrate relative to the deposition point and by varying gas temperature, the gas pressure and composition, the relative flow rates through the upper and lower branches and so on. The structure of the deposited layer can be varied by the choice of powdered material (or mix of powders) and the particle size distribution.

Despite the promising properties of copper-diamond composites described above, it is necessary to ensure a good bond with the underlying substrate. Since the preferred top layer is a matrix of copper with embedded diamond, and the most commercially important substrate is silicon, tests were performed on CS copper layers deposited on silicon substrates.

When choosing a powder particle size the CS performance is not the only consideration. Very fine powders (e.g. 1 μm) are difficult to handle because fine powder clumps and can clog the feeder, and small particles can also pose potential health hazards. Nevertheless, as shown below, such small particle sizes may be useful, if appropriate material handling safeguards are put in place.

On the other hand, copper powder with a particle size of 30 μm is easy to handle but examination of CS 30 μm copper on silicon revealed cracks in the silicon substrate which appears to be due to the momentum of the supersonic, relatively heavy particles.

A 30 μm copper layer was deposited on silicon, and adhesive strength measured with a tape test in which Scotch Klebeband pressure sensitive tape was applied to the deposited copper layer and the tape was then pulled away, to see if the copper came away with the tape or remained fixed on the silicon (Scotch Klebeband is a trade mark of 3M Corporation).

Figure 5:
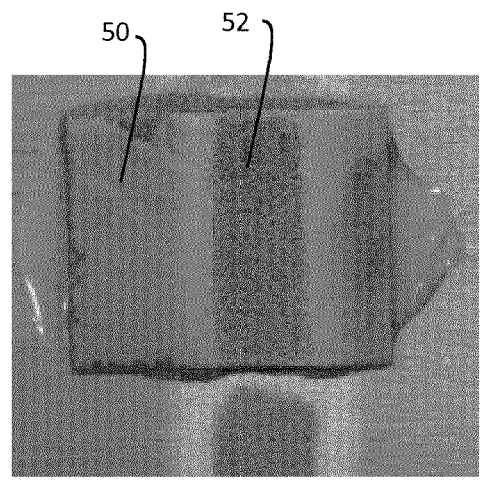
FIG. 5 shows a sample of cold sprayed 30 μm copper on silicon.
Figure 6:
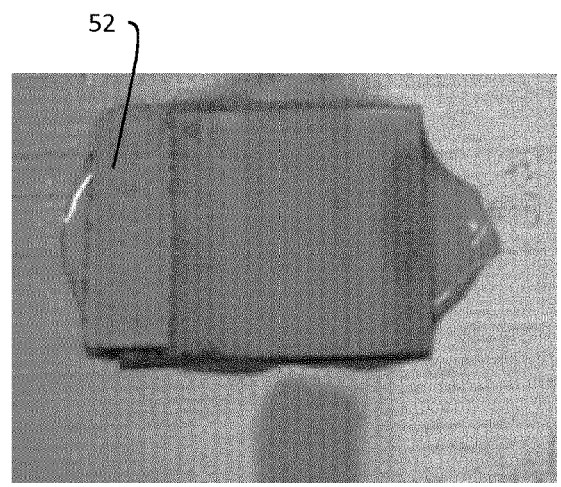
FIG. 6 shows the result of a tape test on the sample of FIG. 5.

Referring to FIG. 5, while the 30 μm copper 52 did bond to the silicon substrate 50, the adhesive strength was not high and it failed the tape test, as seen in FIG. 6. As noted above a microscopic analysis showed also that this particle size damaged the substrate by inducing cracking.

Figure 7:
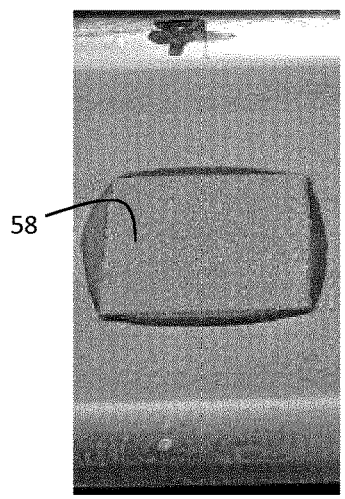
FIG. 7 shows a sample of cold sprayed 30 μm aluminium on silicon.

FIG. 7 shows a cold sprayed layer 58 formed from 30 μm aluminium powder on silicon. Unlike 30 μm copper the aluminium bonds strongly to the silicon, and passes the tape test. Furthermore, it has none of the material handling drawbacks of the 1 μm copper, and it also is robust enough to permit additional layers to be built on top.

Several examples of a thermal structure will now be discussed.

Example 1

FIG. 8 shows a three-layer structure on top of silicon. First, in FIG. 8(a), a base layer is formed by cold spraying 30 μm (average particle size) aluminium. Then, in FIG. 8(b), an intermediate layer is formed by cold spraying 30 μm copper. Finally, in FIG. 8(c), a copper diamond matrix top layer is formed by cold spraying a mixture of 30 μm copper and 80 μm diamond powder.

FIGS. 9(a) to 9(c) are SEM micrographs through the three samples of FIGS. 8(a) to 8(c) respectively. The magnitude of FIG. 9(a) is incidentally twice that of FIGS. 9(b) and 9(c), i.e. a length scale marker in the lower left side of each indicates a length of 0.250 mm in 9(a) and the corresponding scale markers indicate lengths of 0.504 mm and 0.506 mm in 9(b) and (c) respectively.

Figure 10:
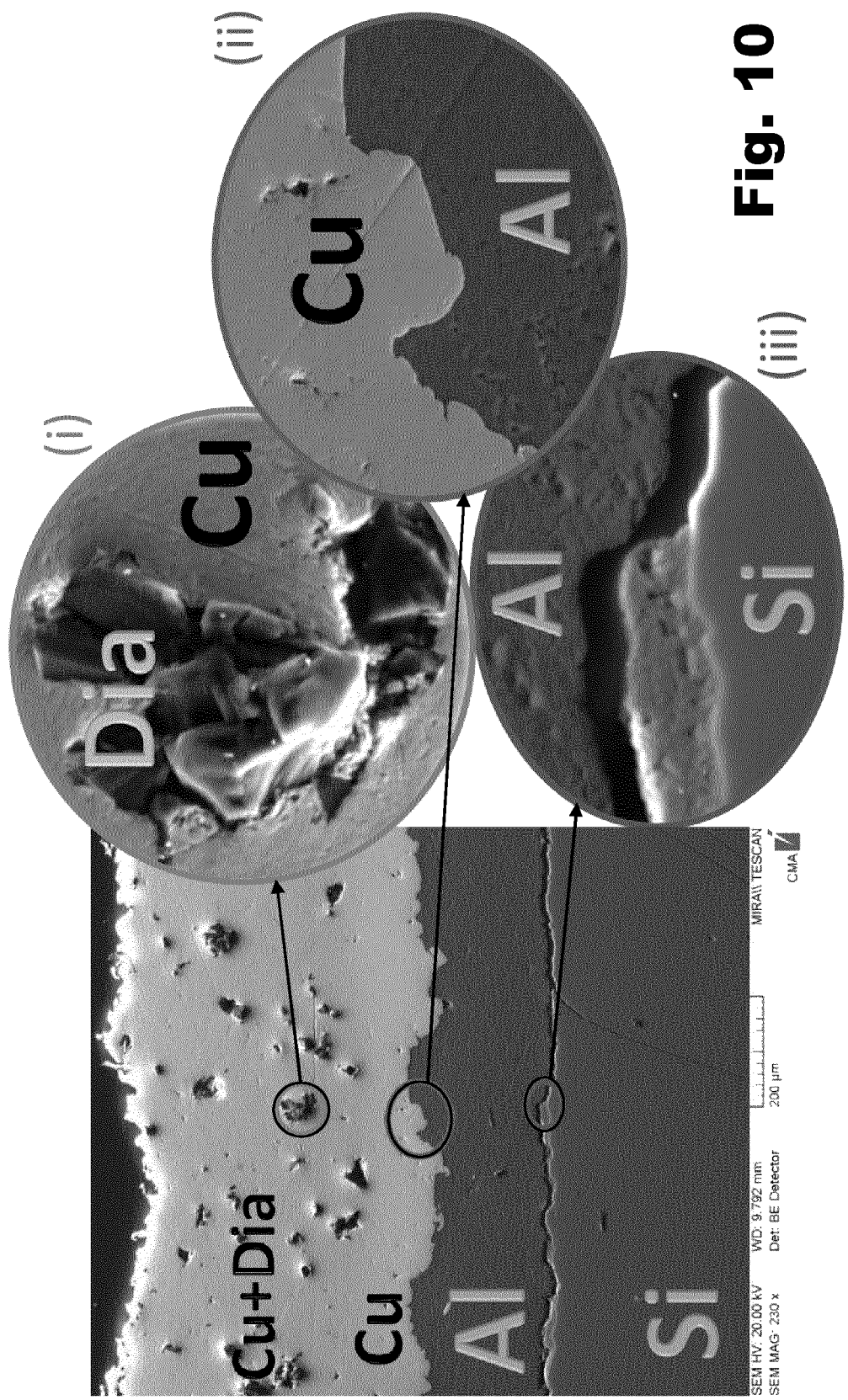
FIG. 10 is a detailed SEM cross section of the structure formed in FIGS. 8(a) to 8(c)

FIG. 10 provides a more detailed SEM cross section through the finished structure, with details magnified of a diamond particle (i), the Cu—Al interface (ii), and the Al—Si interface (iii).

From detail (i) it can be seen that the diamond is in intimate contact with the surrounding copper matrix, which is important to ensure that the performance agrees with the theoretical predictions as shown in FIG. 2. As previously noted, sintering of copper and diamonds does not provide this kind of intimate contact.

From details (ii) and (iii) it can be seen that the layers are in close contact with one another at the interfaces, reducing thermal inefficiencies.

While the bulk copper-diamond layer is essentially a continuous matrix with properly embedded diamond particles, the top surface formed using cold spray is far from smooth at a microscopic level.

Figure 11:
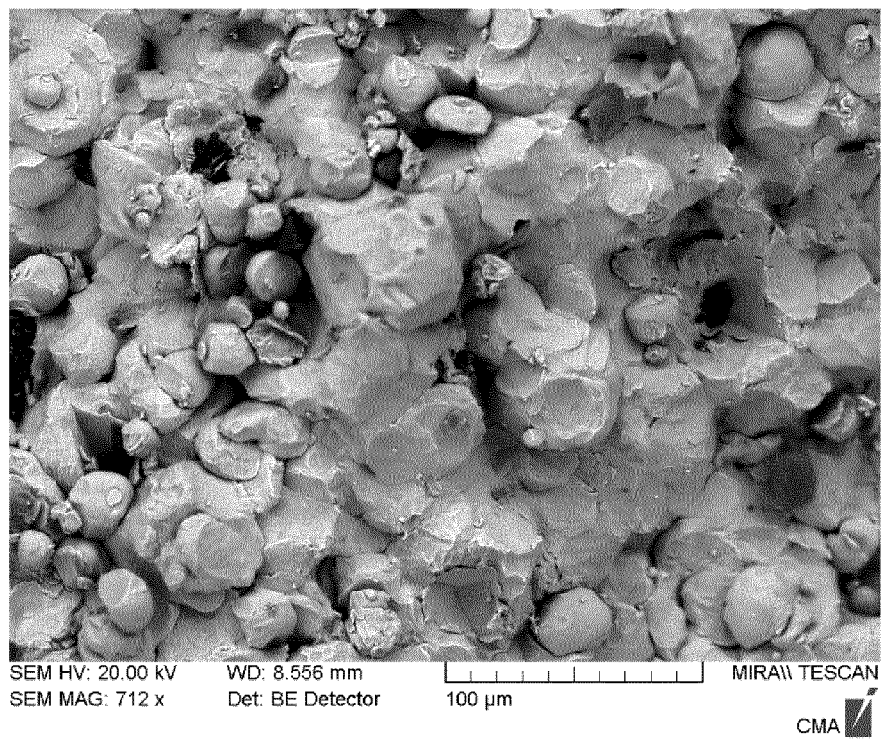
FIG. 11 is a SEM micrograph of the finished structure taken from above.

FIG. 11 is a SEM micrograph of the top surface taken from above, and it reveals numerous bumps, hollows and surface features. Surface feature analysis shows that the areal roughness parameters of this surface have the following values:

Sa (average of absolute profile heights measured over a unit surface in the XY plane):
8.588 μm Sq (root mean squared): 10.767 μm Ssk (Skewness: symmetry about mean): 0.363

Sku (kurtosis: measure of sharpness): 2.83

Sy (maximum height of the profile): 69.625 μm

It can be seen that even without any post-processing, the finished surface is highly porous and irregular which is of significant benefit for a thermal dissipation surface and this makes the structure particularly suitable for cooling high-power electronic devices, particularly using liquid cooling techniques. Experiments show that there is wicking in the copper-diamond composite, proving that there is porosity. The roughness and porosity of the upper part of the top layer can be increased further by varying the cold spray parameters to "disimprove" the deposition of the mixture in the final part of spraying, e.g. by reducing the feed rate of powder, translating the workpiece more quickly relative to the stream of particles, or adjusting other variables in the process.

A significant advantage of the structures disclosed herein is that they can be created in a single continuous cold spraying process to build up the various CS layers onto the semiconductor substrate, making this a fast and inexpensive method of manufacturing a high-performance thermal dissipation structure.

Figure 12:
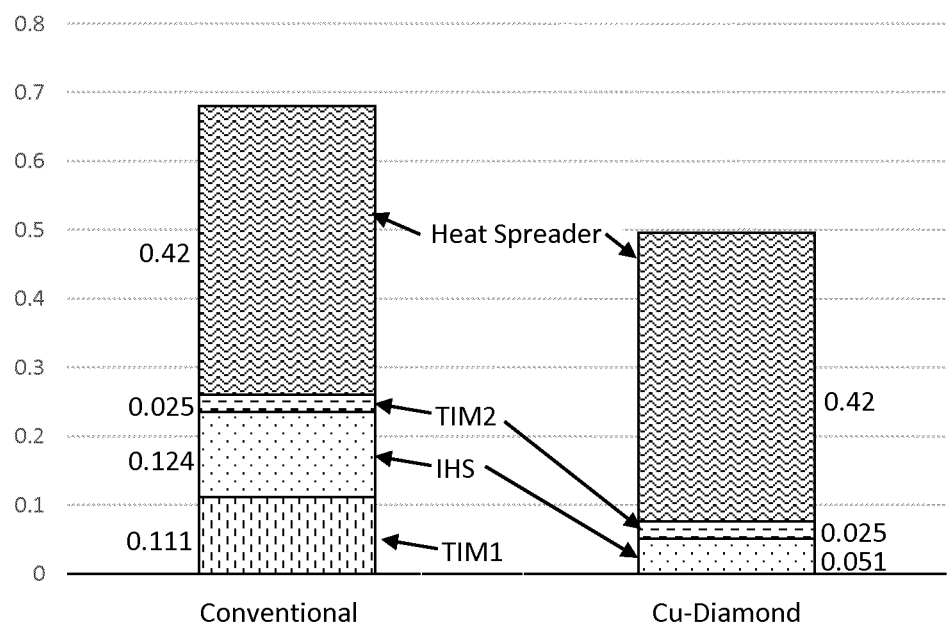
FIG. 12 is a comparison of thermal resistance for conventional structures and copper-diamond structures.

FIG. 12 is a comparison of the thermal resistance budgets for the conventional design of FIG. 1 (left-hand column in FIG. 12) and for a thermal structure comprising an integrated heat spreader formed of a copper-diamond cold-sprayed layer deposited directly onto silicon (right-hand column).

As can be seen, the thermal resistance budget for the conventional design is 0.68 K/W, which arises from the consecutive components (starting from the silicon surface) of the TIM 1 layer (0.111), integrated heat spreader (IHS) of copper (0.124), TIM 2 layer (0.025) and a fan-fin heat sink (0.42). In comparison, the novel design has a thermal resistance of 0.496, made up of an IHS of cold sprayed copper-diamond (0.051), and the same values for the TIM 2 layer and the heat sink. Because of the reduced value for the IHS, and the elimination of a TIM 1 layer, the thermal resistance is reduced by almost 30%. This translates to a 15° C. junction temperature drop at the thermal design power.

The above figures are based on a chip having dimensions of 15 mm by 15 mm, onto which an Al layer is cold sprayed using particles of 30 µm, to a thickness of 75 µm, before a 40:60 powder mixture of 30 µm copper and 30 µm diamond is cold sprayed to a thickness of 2.5 mm.

The base layer shown and described in the embodiments above need not be aluminium and some further examples below provide alternative base layers. The copper intermediate layer is optional.

Example 2

In this example, the same structure is provided as in Example 1, but the aluminium base layer is formed by electro deposition. This could be varied further by using physical or chemical vapour deposition (PVD or CVD), os using some other technique. It is however important to ensure that whatever deposition or formation method is employed, the base layer is in intimate contact with the substrate and has a high degree of continuity so that an efficient thermal transfer is provided through the base layer from the substrate to the top layer.

Example 3

A copper base layer was substituted for the aluminium base layer of example 1. The copper base layer was cold sprayed using 1 µm copper particles.

Figure 13:
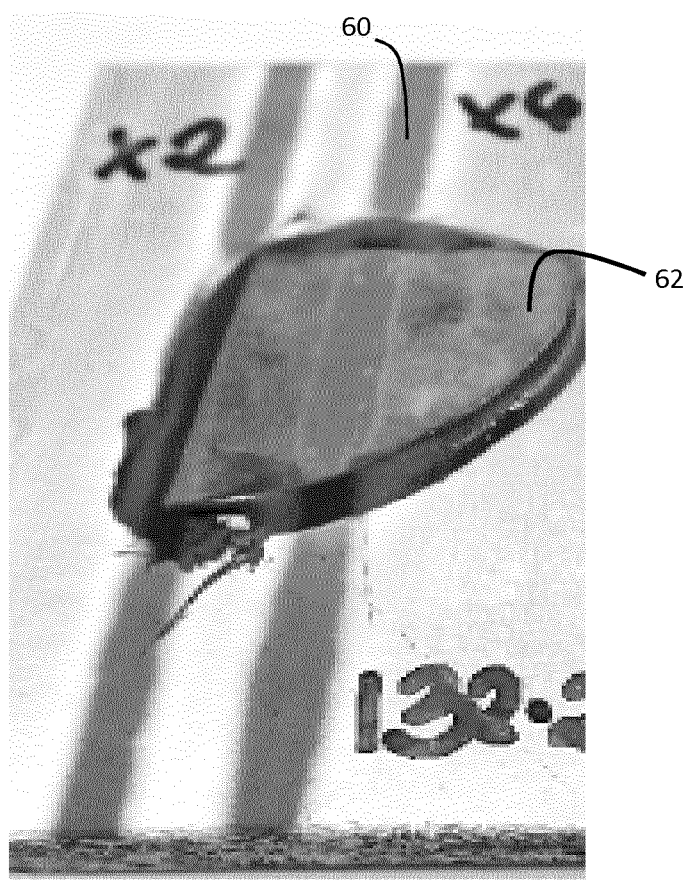
FIG. 13 shows a sample of cold sprayed 1 μm copper on silicon.

FIG. 13 shows a photograph of an experimental test where a track of 1 µm copper powder 60 is cold sprayed onto a silicon wafer 62. Adhesive strength was measured with a tape test in which Scotch Klebeband pressure sensitive tape was applied to the deposited copper layer and the tape was then pulled away, to see if the copper came away with the tape or remained fixed on the silicon (Scotch Klebeband is a trade mark of 3M Corporation). It was found that the copper bonded strongly and did not come away.

The particle size used could be smaller or larger. It is preferred to use copper powder with an average size in the range 1-10 µm. The larger the particle, the easier it is to handle, but the more energy it imparts to the substrate on impact. The cold spray parameters will also influence the impact energy and different substrates will have different limits for impact energy to avoid fracture or damage.

In constructing the thermal structure, the copper base layer is deposited to 30 µm followed by cold spraying of the (optional) intermediate layer of copper and the top layer of copper-diamond. A minimum of 20 µm is preferred to withstand the impact of the cold sprayed particles onto the copper base layer.

Example 4

A thermal structure is formed with a base layer and top layer, with no intermediate layer. Both the base layer and top layer are formed from a copper-diamond matrix. As before a 30 µm copper and 80 µm diamond mix is used for the top layer. For the base layer, a 3 µm copper powder is mixed with a 5 µm diamond grit, and these are cold sprayed to build up a base layer which has good adhesion, excellent thermal characteristics and which shields the substrate when the top layer is sprayed on with a higher average incident particle energy.

In a variation of this technique, small (1-10 µm) copper-clad diamond particles could be substituted for the mix of small copper powder/diamond grit.

Example 5

The base layer is homogeneous with the top layer, both being formed in a continuous cold spraying process using the same 3 µm copper powder mixed with a 5 µm diamond grit. This example differs from the others in that it does not employ a distinct base layer but rather has a single layer with both base layer functionality and top layer functionality.

The invention claimed is:

1. A thermal structure for dissipating heat from a substrate, comprising:
    a semiconductor substrate having an external surface;
    a base layer of a ductile material capable of exhibiting plastic deformation, formed on top of said external surface; and
    a top layer comprising a matrix of metal and diamond formed above the base layer by cold spraying a powder selected from:
        a powder mixture of metal and diamond particles, and
        a powder of metal-clad diamond particles,
    wherein the top layer is formed of a matrix of metal formed by the deformation of the metal components of the powder on impact with the underlying surface and a dispersed phase comprising the diamond particles embedded within the metal matrix.

2. A thermal structure according to claim 1, wherein said base layer is formed on top of said external surface by a cold spraying process, wherein the base layer is formed of (i) a metal, (ii) a composite comprising at least two metals, or (iii) a composite comprising a metal and a non-metal.

3. A thermal structure according to claim 1, wherein the base layer is formed of aluminium or of a composite of aluminium and one or more metal or non-metal components.

4. A thermal structure according to claim 3, wherein said base layer is formed by cold spraying aluminium powder having an average particle size of between 5 and 100 µm, more preferably between 10 and 60 µm.

5. A thermal structure according to claim 2, wherein said base layer has an average thickness between 30 and 500 µm, more preferably between 50 and 250 µm.

6. A thermal structure according to claim 1, wherein the base layer is formed of copper, of a composite of copper and one or more metal or non-metal components.

7. A thermal structure according to claim 6, wherein said base layer is formed by cold spraying copper powder or a composite containing copper and having an average particle size of between 0.5 and 15 µm, more preferably between 1 and 10 µm.

8. A thermal structure according to claim 6, wherein said base layer is formed by cold spraying either a powder mixture of metal and diamond particles, or a powder of metal-clad diamond particles, said powder mixture or powder having an average particle size of between 0.5 and 15 µm, more preferably between 1 and 10 µm.

9. A thermal structure according to claim 6, wherein said base layer has an average thickness between 5 and 50 µm, more preferably between 10 and 30 µm.

10. A thermal structure according to claim 1, wherein said base layer comprises aluminium and copper, and is formed by cold spraying a mixture of copper and aluminium particles.

11. A thermal structure according to claim 10, wherein said base layer comprises a mix of aluminium and copper in the ratio (w/w) of between 30:70 and 70:30, more preferably between 40:60 and 60:40.

12. A thermal structure according to claim 1, wherein said external surface of the substrate is roughened prior to formation of the base layer by a process selected from chemical etching, sand blasting and laser etching.

13. A thermal structure according to claim 1, wherein said external surface of said substrate has a roughness average ($R_a$) value of between 1 and 25 μm, more preferably between 3 and 20 μm, most preferably between 7 and 15 μm.

14. A thermal structure according to claim 1, wherein said metal in said top layer is copper.

15. A thermal structure according to claim 1, wherein said top layer comprises a mix of copper and diamond in the ratio (w/w) of 30:70 and 90:10, more preferably between 50:50 and 90:10, even more preferably between 75:25 and 90:10, most preferably around 80:20.

16. A thermal structure according to claim 1, wherein said powder is a powder mixture of metal and diamond particles and wherein said metal particles have an average size of between 10 and 60 μm.

17. A thermal structure according to claim 1, wherein said diamond particles in said mixture or in said metal-clad diamond particles have an average size of between 10 and 200 μm, more preferably between 20 and 100 μm.

18. A thermal structure according to claim 1, wherein said powder is a powder of metal-clad diamond particles, with the metal being copper.

19. A thermal structure according to claim 18, wherein the particles comprise diamond grit having an average size in the range 20-100 μm, and coated with a copper layer 2-8 μm thick.

20. A thermal structure according to claim 18, wherein the particles further comprise a 1-3 μm layer thickness of nickel applied to the diamond to assist with copper deposition, with the copper layer being applied over the nickel layer.

21. A thermal structure according to claim 18, wherein in each grain the preferred weight ratio between diamond and metal is between 70-30 and 30-70, more preferably approximately 50-50.

22. A thermal structure according to claim 1, wherein said top layer has an average thickness of between 0.3 mm and 5 mm.

23. A thermal structure according to claim 1, further comprising an intermediate layer of copper formed on top of said base layer by a cold spraying process, with the top layer being cold sprayed onto said intermediate layer.

24. A thermal structure according to claim 23, wherein said intermediate layer is formed by cold spraying copper powder having an average particle size of between 10 and 60 μm.

25. A thermal structure according to claim 23, wherein said intermediate layer has an average thickness of between 0.1 mm and 1 mm.

26. A thermal structure according to claim 1, wherein the top layer, at the outer surface distal from the substrate, is provided with multi-scale features relative to the bulk of the top layer, with a preferred feature size of between 0.5 μm and 120 μm.

27. A thermal structure according to claim 26, wherein said increased porosity results from variation of the cold spray parameters during the application of the outermost part of the top layer by one or more of: varying the nozzle inlet pressure, the standoff distance, the particle feed rate, and the relative movement between substrate and nozzle.

28. A thermal structure according to claim 1, wherein said substrate is a semiconductor.

29. A thermal structure according to claim 28, wherein said semiconductor is one of silicon, germanium, gallium arsenide, silicon carbide, gallium nitride, gallium phosphide or cadmium sulphide.

30. A method of manufacturing a thermal structure for dissipating heat from a substrate, comprising the steps of:
providing a semiconductor substrate having an external surface; and
forming a base layer of a ductile material capable of exhibiting plastic deformation, on top of said external surface; and
forming a top layer above the base layer by cold spraying a powder selected from:
a powder mixture of metal and diamond particles, and
a powder of metal-clad diamond particles;
whereby a matrix of metal is formed by the deformation of the metal particles on impact with the underlying surface and a dispersed phase comprising the diamond particles is embedded within the metal matrix.

* * * * *